(12) United States Patent
Bierhuizen et al.

(10) Patent No.: US 9,385,285 B2
(45) Date of Patent: Jul. 5, 2016

(54) LED MODULE WITH HIGH INDEX LENS

(75) Inventors: Serge J. Bierhuizen, Santa Rosa, CA (US); Nanze Patrick Wang, San Jose, CA (US); Gregory W. Eng, Fremont, CA (US); Decai Sun, Los Altos, CA (US); Yajun Wei, Sunnyvale, CA (US)

(73) Assignees: KONINKLIJKE PHILIPS N.V., Eindhoven (NL); LUMILEDS LLC, San Jose, CA (US)

( * ) Notice: Subject to any disclaimer, the term of this patent is extended or adjusted under 35 U.S.C. 154(b) by 500 days.

(21) Appl. No.: 12/561,617

(22) Filed: Sep. 17, 2009

(65) Prior Publication Data

US 2011/0062471 A1    Mar. 17, 2011

(51) Int. Cl.
| H01L 33/56 | (2010.01) |
| H01L 33/58 | (2010.01) |
| H01L 33/48 | (2010.01) |

(52) U.S. Cl.
CPC .............. *H01L 33/58* (2013.01); *H01L 33/486* (2013.01); *H01L 2924/0002* (2013.01)

(58) Field of Classification Search
CPC ........ C09K 11/02; H01L 33/56; H01L 33/58; H01L 33/486; H01L 2224/48091; H01L 2924/12041; H01L 33/50; H05K 2201/10106
USPC ......... 257/13, 98, 99, 433; 313/501; 362/296, 362/294
See application file for complete search history.

(56) References Cited

U.S. PATENT DOCUMENTS

| 5,444,520 | A | 8/1995 | Murano |
| 6,850,001 | B2 | 2/2005 | Takekuma et al. |
| 7,361,938 | B2 | 4/2008 | Mueller |
| 8,610,138 | B2 | 12/2013 | Lee et al. |
| 2003/0189830 | A1* | 10/2003 | Sugimoto et al. ............. 362/294 |
| 2004/0041222 | A1* | 3/2004 | Loh .......................... H01L 33/58 257/433 |
| 2005/0057144 | A1* | 3/2005 | Morita et al. .................. 313/501 |
| 2006/0054912 | A1* | 3/2006 | Murakami et al. .............. 257/99 |
| 2006/0054914 | A1 | 3/2006 | Hsian Yi |
| 2006/0157726 | A1* | 7/2006 | Loh ....................... H01L 33/486 257/100 |
| 2006/0180925 | A1 | 8/2006 | Lee et al. |
| 2007/0075306 | A1* | 4/2007 | Hayashi et al. .................. 257/13 |
| 2008/0049430 | A1* | 2/2008 | Sakumoto .............. C09K 11/02 362/296.07 |
| 2008/0054288 | A1* | 3/2008 | Harrah .................... H01L 33/56 257/99 |
| 2008/0079182 | A1 | 4/2008 | Thompson et al. |

(Continued)

FOREIGN PATENT DOCUMENTS

| CN | 1465106 A | 12/2003 |
| DE | 202005013751 U1 | 1/2006 |

(Continued)

OTHER PUBLICATIONS

Philips Lumileds Lighting Company, LLC U.S. Appl. No. 12/561,342.

(Continued)

*Primary Examiner* — Jerome Jackson, Jr.
*Assistant Examiner* — Fang-Xing Jiang

(57) ABSTRACT

An array of housings with housing bodies and lenses is molded, or an array of housing bodies is molded and bonded with lenses to form an array of housings with housing bodies and lenses. Light-emitting diodes (LEDs) are attached to the housings in the array. An array of metal pads may be bonded to the back of the array or insert molded with the housing array to form bond pads on the back of the housings. The array is singulated to form individual LED modules.

3 Claims, 16 Drawing Sheets

(56) References Cited

U.S. PATENT DOCUMENTS

| | | |
|---|---|---|
| 2009/0078950 A1 | 3/2009 | Sun |
| 2011/0062469 A1 | 3/2011 | Camras |

FOREIGN PATENT DOCUMENTS

| | | | |
|---|---|---|---|
| EP | 0454174 | A1 | 10/1991 |
| EP | 1383175 | A1 | 1/2004 |
| EP | 1524705 | A2 | 4/2005 |
| JP | 2003-110146 | A | 4/2003 |
| JP | 2003-124525 | A | 4/2003 |
| JP | 2004-214436 | A | 7/2004 |
| JP | 2004-335740 | A | 11/2004 |
| JP | 2004349647 | A | 12/2004 |
| JP | 2005-101665 | A | 4/2005 |
| JP | 2005-538550 | A | 12/2005 |
| JP | 2006-114854 | A | 4/2006 |
| JP | 2006-173326 | A | 6/2006 |
| JP | 2006-237141 | A | 9/2006 |
| JP | 2007-116138 | A | 5/2007 |
| JP | 2007-123777 | A | 5/2007 |
| JP | 2007214522 | A | 8/2007 |
| WO | 02069409 | A1 | 9/2002 |
| WO | 2006117710 | A1 | 11/2006 |

OTHER PUBLICATIONS

EPO as ISA, PCT/IB2010/053772, filed Aug. 20, 2010 International Search Report and Written Opinion dated Apr. 15, 2011, 17 pages.

First Office Action issued Apr. 15, 2014 from Chinese Patent Application No. 201080041382.2.

Second Office Action issued Sep. 12, 2014 from Chinese Patent Application No. 201080041382.2.

Third Office Action issued Dec. 25, 2014 from Chinese Patent Application No. 201080041382.2.

Office Action issued Feb. 4, 2015 from ROC (Taiwan) Patent Application No. 099128119.

Office Action mailed Jun. 2, 2015 from Japanese Patent Application No. 2012-529369.

Office Action issued Apr. 13, 2016 from ROC (Taiwan) Patent Application No. 104129079.

\* cited by examiner

LED MODULE WITH HIGH INDEX LENS

STATEMENT OF GOVERNMENT SPONSORED RESEARCH

One or more embodiments of this invention were made with Government support under contract no. DE-FC26-08NT01583 awarded by Department of Energy. The Government has certain rights in this invention.

FIELD OF INVENTION

The present disclosure relates to light-emitting diode (LED) modules.

DESCRIPTION OF RELATED ART

In some light-emitting diode (LED) modules, a lens is bonded or over-molded over an LED. The LED modules are soldered to a substrate, such as a printed circuit board. Depending on the contact area between the lens and the LED, the lens may detach from the LED die during use.

An LED may include multiple LED dies, such as thin film flip chips, mounted on a submount. For a dome-like lens to extract the most light from the LED devices, it should be larger than the LED dies. This would require a larger submount to provide the area to receive the lens, consequently increasing the cost of the module as substrates can be expensive.

SUMMARY

In one or more embodiments of the present disclosure, an array of housings with housing bodies and lenses is molded, or an array of housing bodies is molded and bonded with lenses to form an array of housings with housing bodies and lenses. Light-emitting diodes (LEDs) are attached to the housings in the array. An array of metal pads may be bonded to the back of the array or insert molded with the housing array to form bond pads on the back of the housings. The array is singulated to form individual LED modules.

BRIEF DESCRIPTION OF THE DRAWINGS

In the drawings.

Use of the same reference numbers in different figures indicates similar or identical elements.

DETAILED DESCRIPTION

Figure 1:
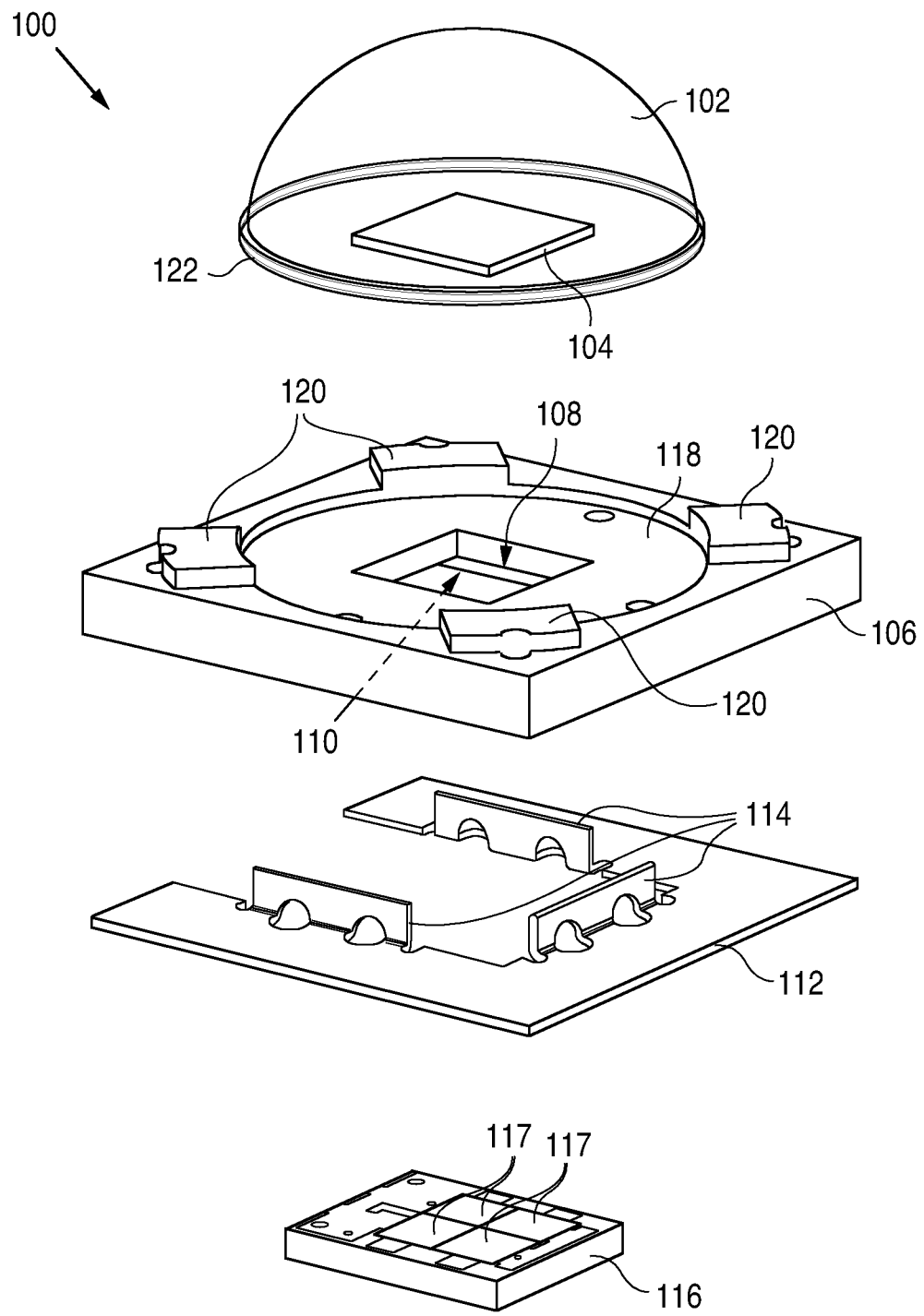
FIGS. 1, 2, and 3 illustrate exploded, assembled, and cross-sectional views of an LED module in one or more embodiments of the present disclosure.
Figure 2:
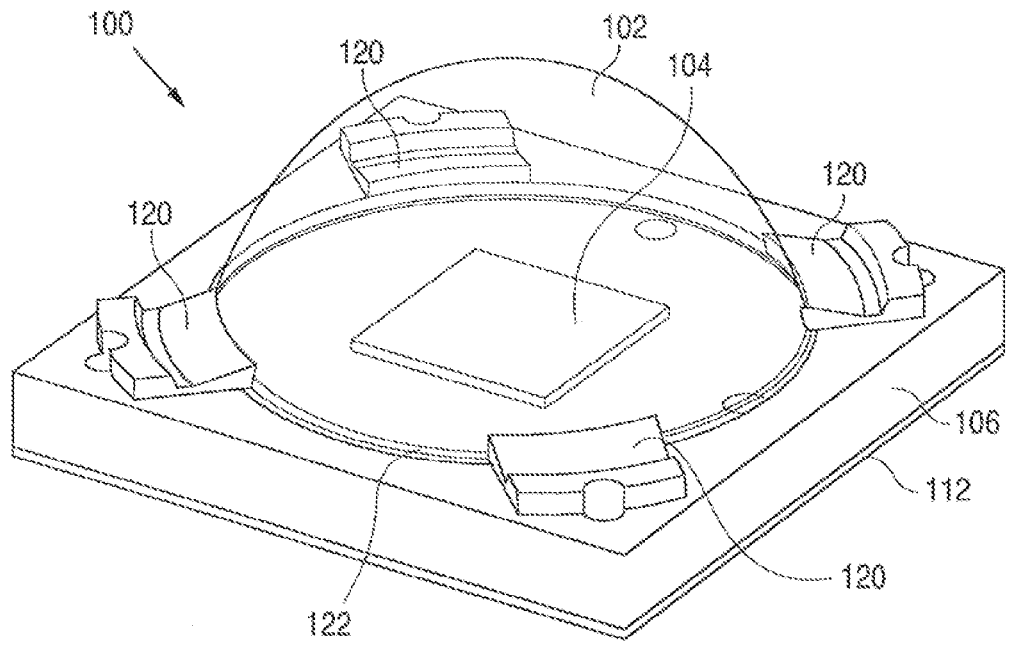
Figure 3:
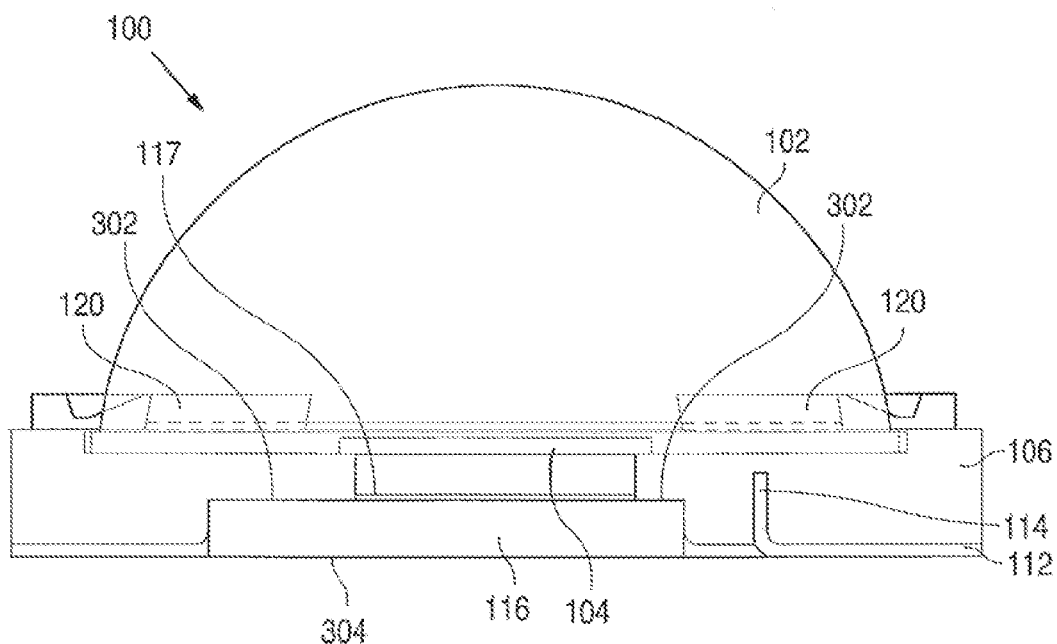

FIGS. 1, 2, and 3 respectively illustrate an exploded view, a perspective assembled view, and a cross sectional assembled view of a light-emitting diode (LED) module 100 in one or more embodiments of the present disclosure. Module 100 includes a lens 102, a wavelength converting element 104, a housing body 106 with a top opening 108 coupled to a bottom opening 110, a metal shim 112 with molding tabs 114, and an LED 116 with one or more LED dies 117.

Lens 102 may be a conventionally molded glass lens. Common moldable glass materials include B270, Pyrex, Tempax, Borofloat 33, and F2 glass. Alternatively lens 102 may be another material with refractive index (RI) of 1.5 or greater (e.g., 1.7 or greater), such as high RI glass (e.g., S-LAH51), sapphire, cubic zirconia, or diamond. Lens 102 may also be made of hard or soft silicone with a RI of 1.4 or greater if no wavelength converting element is attached to the lens. Lens 102 has a shape, dome-like or otherwise, that helps to extract light from wavelength converting element 104 and LED die 116.

Wavelength converting element 104 is fixed to the bottom surface of lens 102. Wavelength converting element 104 modifies the emission spectrum of LED dies 117 to provide a desired color. The wavelength converting element may be one or more ceramic phosphor plates as described in U.S. Pat. No. 7,361,938, which is commonly assigned and incorporated herein by reference. Wavelength converting element 104 may be fixed to the bottom surface of lens 102 by a high index bond as described in U.S. patent application Ser. No. 12/561,342, entitled "Molded Lens Incorporating a Window Element," which is concurrently filed, commonly assigned, and incorporated by reference.

Figure 25:
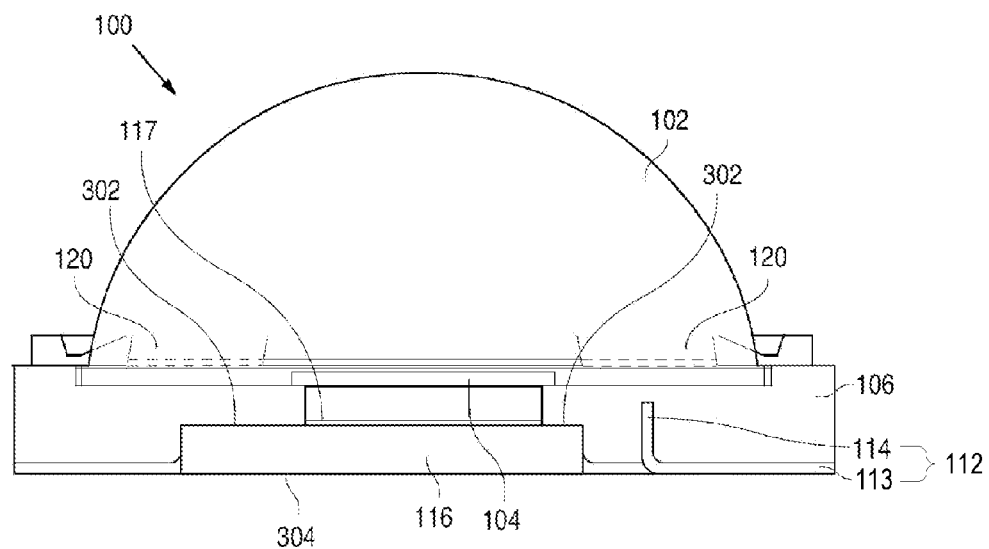
FIG. 25 illustrates a cross-sectional view of an LED module in one or more embodiments of the present disclosure.

Housing body 106 includes a recess 118 and top opening 108 for receiving lens 102 with wavelength converting element 104. Lens 102 is aligned to housing body 106 so that wavelength converting element 104 is located in top opening 108 as shown in FIG. 3, or wavelength element 104 is located above and fully covers top opening 108 as shown in FIG. 25. Lens 102 may be bonded to recess 118 to maintain the alignment. Glue may be applied to the bottom of lens 102, recess 118, or both. The glue may be silicone, epoxy, or another adhesive. Clamps 120 are positioned around recess 118. Clamps 120 may be plastically deformed by heat to clamp down on a rim or flange 122 of lens 102 in a process referred to as "heat staking." As lens 102 is bonded and clamped to housing body 106, the lens should not detach from the housing body. As lens 102 is fixed to housing body 106, its size is not limited by the size of the submount of the LED 116. For example, lens 102 may have a bottom surface that is larger than the top surface of LED 116. Housing body 106 may be a white plastic that is conventionally molded. For example, housing body 106 may be a polyphthalamide (PPA) such as Zytel from DuPont, Amodel from Solvay Advanced Polymers, or a liquid-crystal polymer (LCP).

As top opening 108 is smaller than bottom opening 110 in housing body 106, the ceiling of the bottom opening forms a stop 302 (FIGS. 3 and 5) around the perimeter of the top opening. Stop 302 defines how deeply LED 116 is seated in bottom opening 110 and how far the LED protrudes from the bottom opening. LED 116 is placed into bottom opening 110 and bonded wavelength converting element 104 and stop 302. Glue may be applied to the bottom of wavelength converting element 104, the top of LED 116, or both before the LED is placed. The glue may be silicone, epoxy, or another adhesive. One or more glue overflow channels 502 (FIG. 5) are defined in stop 302 to allow a glue 602 (FIG. 6) to expand or contract without damaging LED dies 117.

LED dies 117 on LED 116 may protrude slightly into top opening 108 or wavelength converting element 104 may protrude slighting into bottom opening 110. In any case, a small gap filled with the glue may exist between the bottom of wavelength converting element 104 and the top of LED dies 117. The sidewalls of top opening 108 and bottom opening 110 are reflective or scattering in order to extract light from LED dies 117 to wavelength converting element 104, and to prevent any edge emission from the LED dies and the wavelength converting element.

LED dies 117 are mounted on a submount or interposer (generally indicated by reference number 116). Each LED die includes an n-type layer, a light-emitting layer (commonly referred to as "active region") over the n-type layer, and a p-type layer over the light-emitting layer. The submount includes a substrate with through-via or on-submount redistribution of the metal pattern of LED dies 117. The submount may couple the LED dies 117 in series or in parallel, redistribute the metal bond pad pattern, or both. The submount includes two or more bond pads 304 (FIGS. 3 and 5) on the back of LED 116.

Metal shim 112 is inserted molded with housing body 106. Metal shim 112 has a base plate 113 abutting the bottom of housing body 106 and molding tabs 114 extending from base plate 113 into housing body 106. Metal shim 112 include holes 115 that are each defined partly in a molding tab 114 and partly in base plate 113. Holes 115 are filled with the housing material that forms a part of housing body 106 so metal shim 112 and housing body 106 form an integral structure. Base plate 113 forms metal bond pads on the bottom of housing body 106. The bond pads (generally indicated by reference number 113) of housing body 106 help bond pads 304 (FIGS. 3 and 5) of LED 116 to fix module 100 to a substrate such as a printed circuit board.

Figure 4:
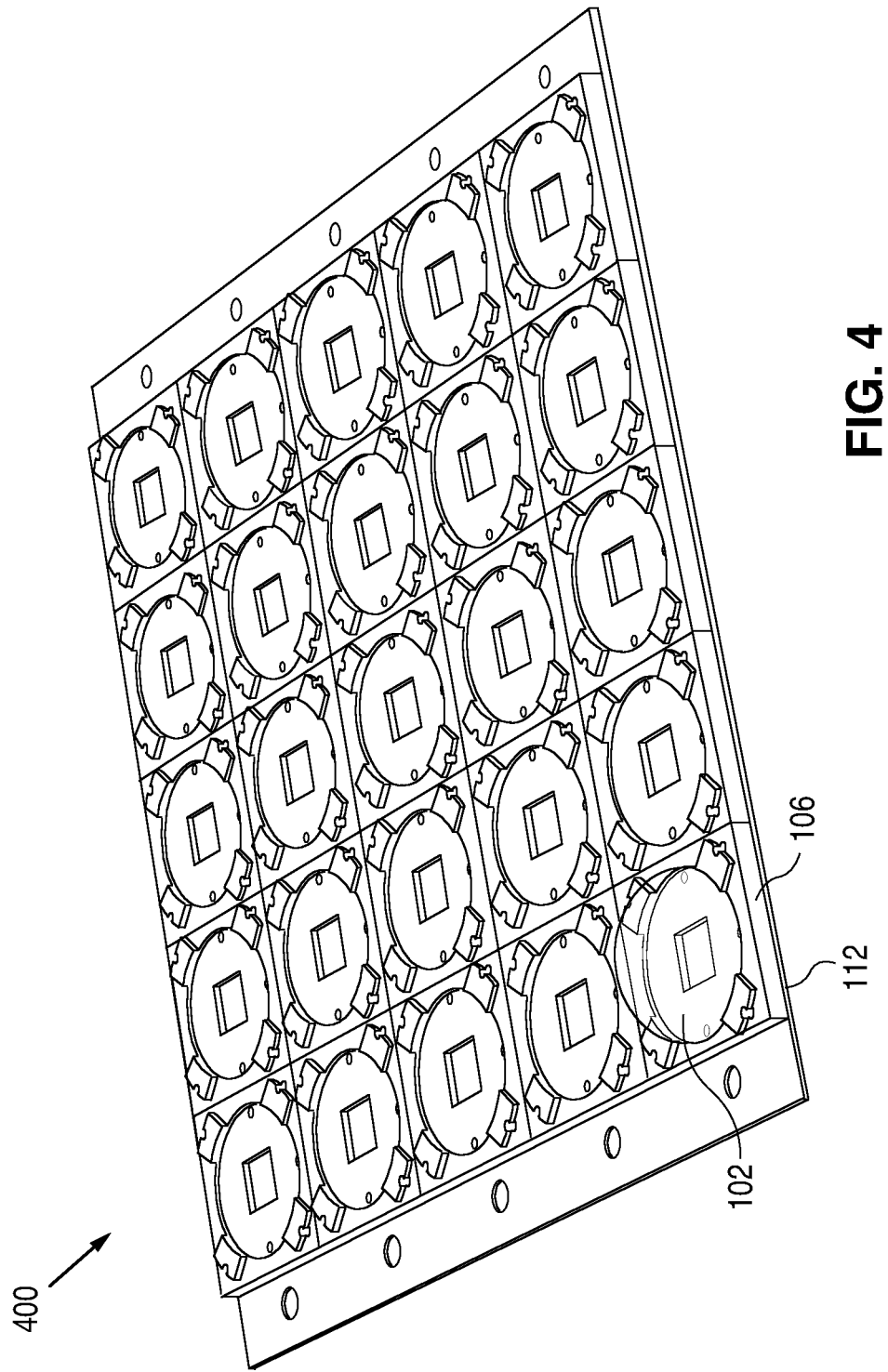
FIG. 4 illustrates a perspective view of an array of housings of FIG. 1 in one or more embodiments of the present disclosure.
Figure 5:
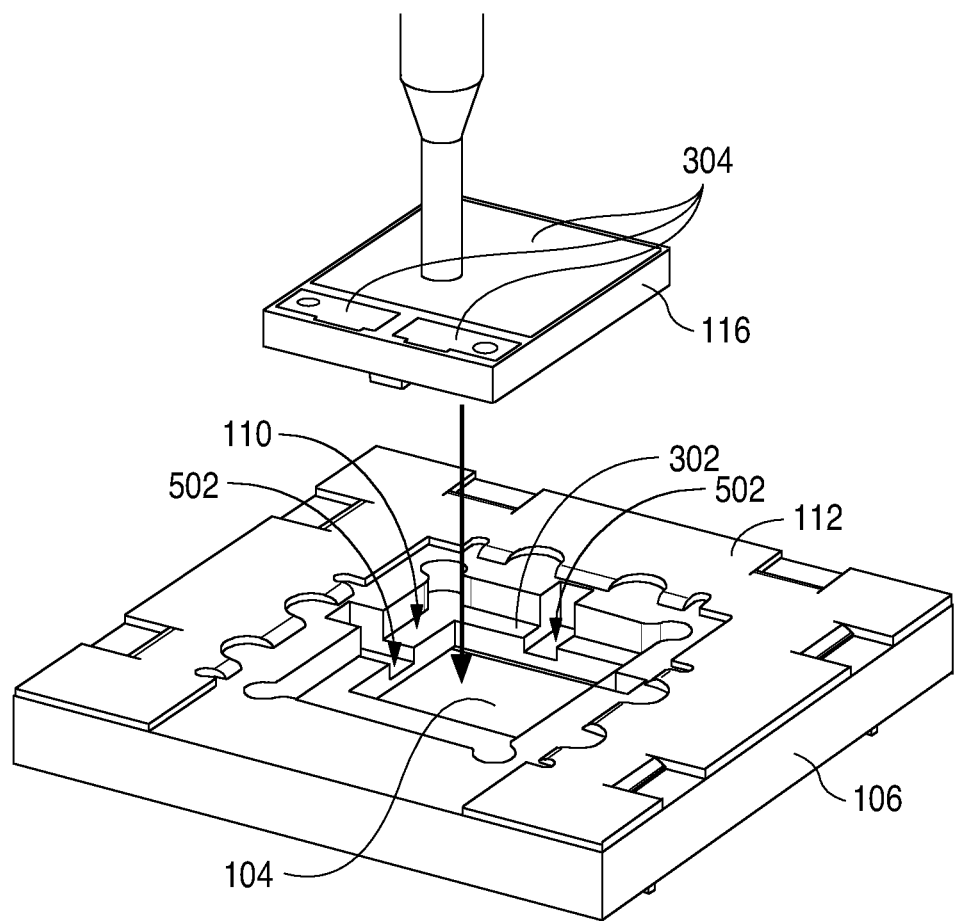
FIG. 5 illustrates a perspective view of the placement of an LED into the housing of FIG. 1 in one or more embodiments of the present disclosure.
Figure 6:
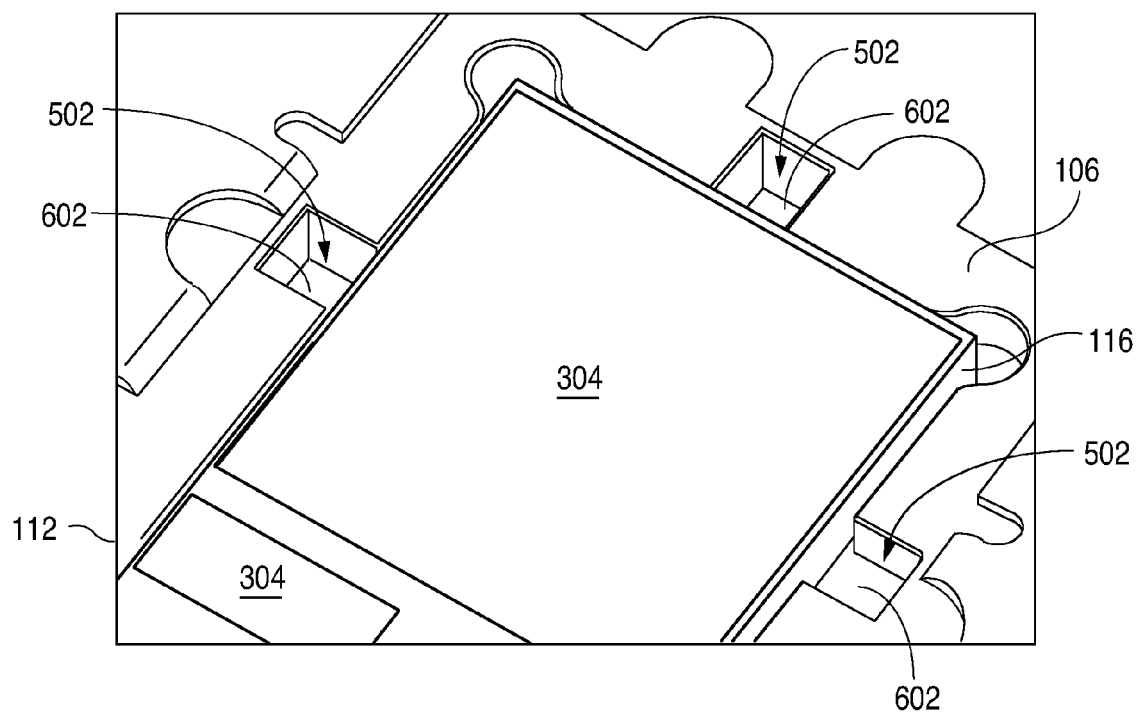
FIG. 6 illustrates a perspective view of the housing with the LED in one or more embodiments of the present disclosure.

Module 100 may be fabricated as follows. Lens 102 may be molded individually or in an array and then separated into individual lenses. An array 400 with housing bodies 106 (only one is labeled) may be insert molded with an array of shims 112 (only one is labeled) as shown in FIG. 4. Array 400 may be any size, and a large array may be separated (e.g., sawed) into smaller arrays for easier handling and processing. Individual lenses 102 may be bonded on and heat staked to housing bodies 106 in array 40. Array 400 may be turned upside down and individual LEDs 116 may be placed into bottom opening 110 and bonded with housing 106 as shown in FIG. 5.

Figure 7:
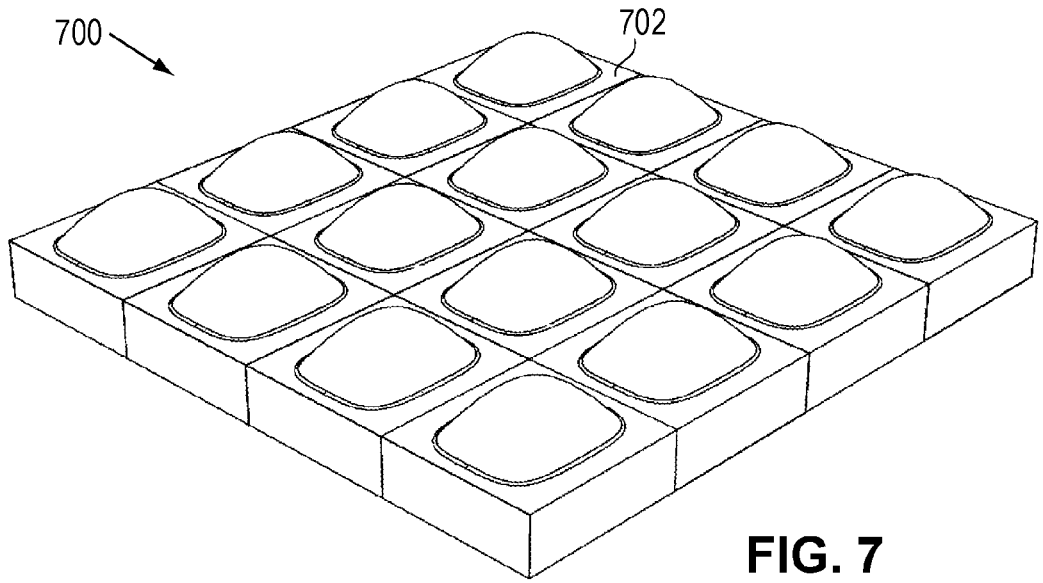
FIG. 7 illustrates a perspective view of an example array of housings each with a housing body and a lens in one or more embodiments of the present disclosure.

FIG. 7 illustrates an example array 700 of housings 702 (only one is labeled) each having a housing body and a lens in one or more embodiments of the present disclosure. Array 700 may be glass that is conventionally molded. Common moldable glass materials include B270, Pyrex, Tempax, Borofloat 33, and F2 glass. Alternatively array 700 may be another high index material with an RI of 1.5 or greater (e.g., 1.7 or greater), such as sapphire, diamond, alumina, or cubic zirconia. Array 700 may also be made of hard or soft silicone with an RI of 1.4 or greater. Array 700 may be any size, and a large array may be separated (e.g., sawed) into smaller arrays for easier handling and processing.

Figure 8A:
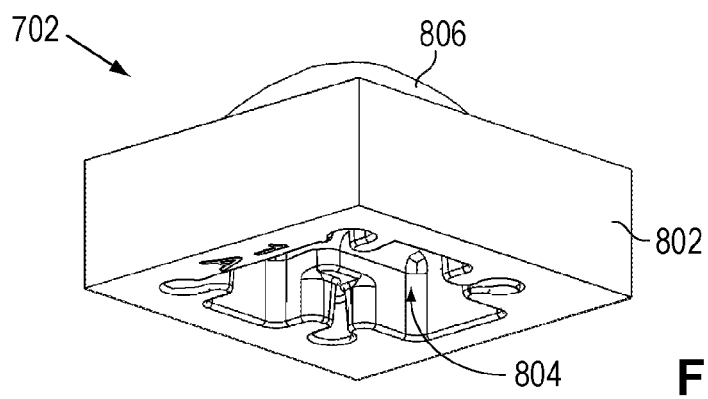
FIGS. 8A and 8B respectively illustrate bottom perspective and plan views of one example housing in the array of FIG. 7 in one or more embodiments of the present disclosure.
Figure 8B:
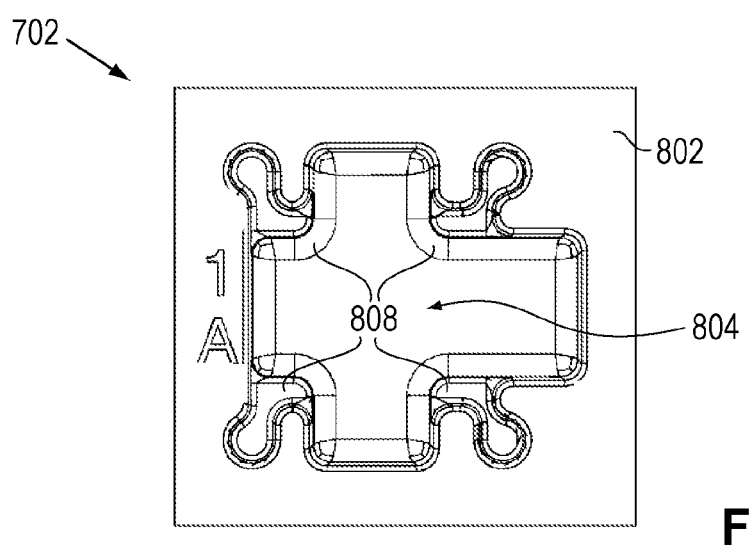

FIGS. 8A and 8B respectively illustrate bottom perspective and plan views of one example housing 702 in array 700 in one or more embodiments of the present disclosure. Housing 702 includes a housing body 802 defining a bottom opening 804 for receiving an LED, and a lens 806 above the housing body. Housing body 802 includes four landing pads/corner stops 808 (FIG. 8B) in bottom opening 804. Corner stops 808 provide an air gap 1304 (FIG. 13) between the top surface of the LED and the bottom surface of lens 806. Corner stops 808 also define how deeply the LED is seated in bottom opening 204 and how far the LED protrudes from the bottom opening. Lens 806 has a shape, dome-like or otherwise, that helps to extract light from the LED. As lens 806 is part of housing body 802, its size is not limited by the size of the submount of the LED. For example, lens 806 may have a bottom surface that is larger than the top surface of the LED.

Figure 9A:
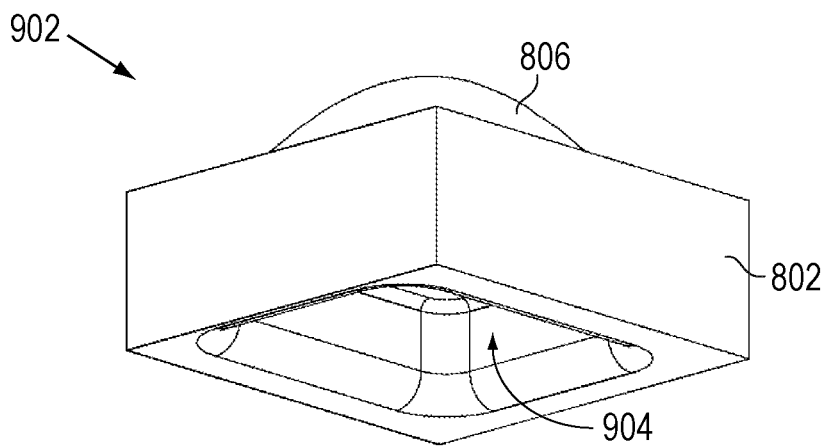
FIGS. 9A and 9B respectively illustrate bottom perspective and plan views of another example housing in the array of FIG. 7 in one or more embodiments of the present disclosure.
Figure 9B:
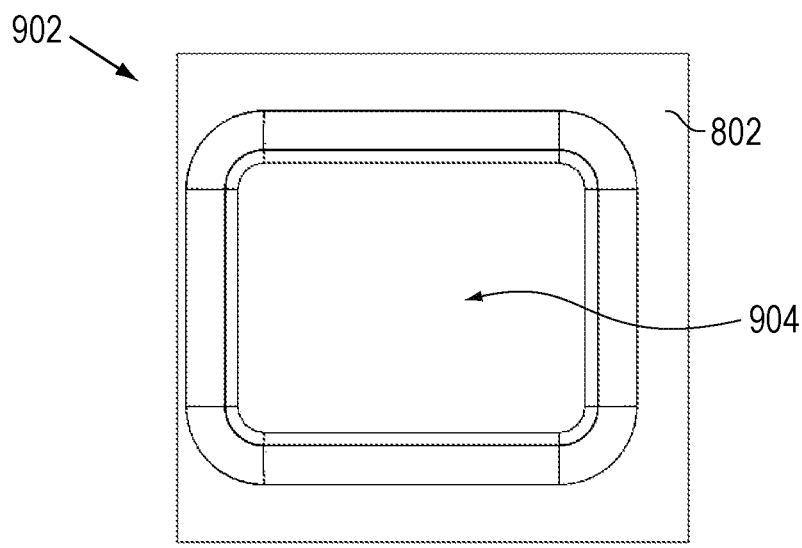

FIGS. 9A and 9B respectively illustrate bottom perspective and bottom plan views of an alternative embodiment housing 702 (hereafter housing 902) in one or more embodiments of the present disclosure. Housing 902 includes a housing body 802 defining a bottom opening 904 for receiving an LED, and a lens 806 above the housing body. Unlike housing 702, housing 902 does not have any corner stops in bottom opening 904 and the LED is seated against the ceiling of the opening so there is no air gap between the top surface of the LED and the bottom surface of lens 806.

Figure 10:
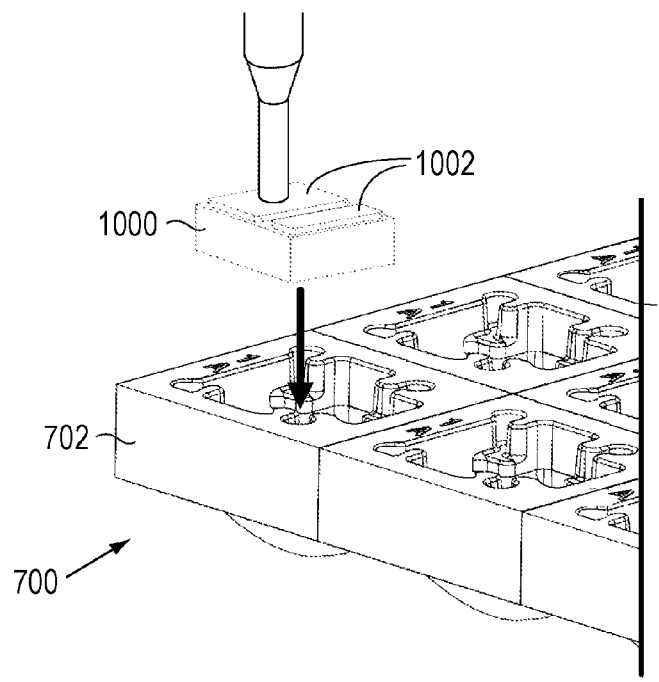
FIGS. 10 and 11 illustrate perspective views of the placement of light-emitting diode (LED) into the housings of the array of FIG. 7 in one or more embodiments of the present disclosure.

FIG. 10 shows that LEDs 1000 (only one is labeled) are placed into bottom openings 804 (FIGS. 8A and 8B) and bonded to corner stops 808 (FIG. 8B) of housings 702. Glue may be applied to corner stops 808, the corners of LED 1000, or both before the LED is placed. The glue may be silicone, epoxy, or another adhesive. LEDs 100 may also be placed into bottom openings 904 and bonded to the ceiling of the opening.

LED 1000 includes one or more LED dies mounted on a submount or interposer. Each LED device includes an n-type layer, a light-emitting layer (commonly referred to as "active region") over the n-type layer, and a p-type layer over the light-emitting layer. Each LED device may include a wavelength converting element over the n-type layer. The wavelength converting element modifies the emission spectrum of the LED device to provide a desired color. The wavelength converting element may be one or more phosphor layers or one or more ceramic phosphor plates. The ceramic phosphor plates are described in U.S. Pat. No. 7,361,938, which is commonly assigned and incorporated herein by reference. The edges of the LED devices may be covered by a side coating to reduce edge emission.

The submount includes a substrate with through-via or on-submount redistribution of the metal pattern of the LED dies. The submount may also couple the LED dies in series or in parallel. The submount includes two or more bond pads 1002 on the back of LED 1000.

Figure 11:
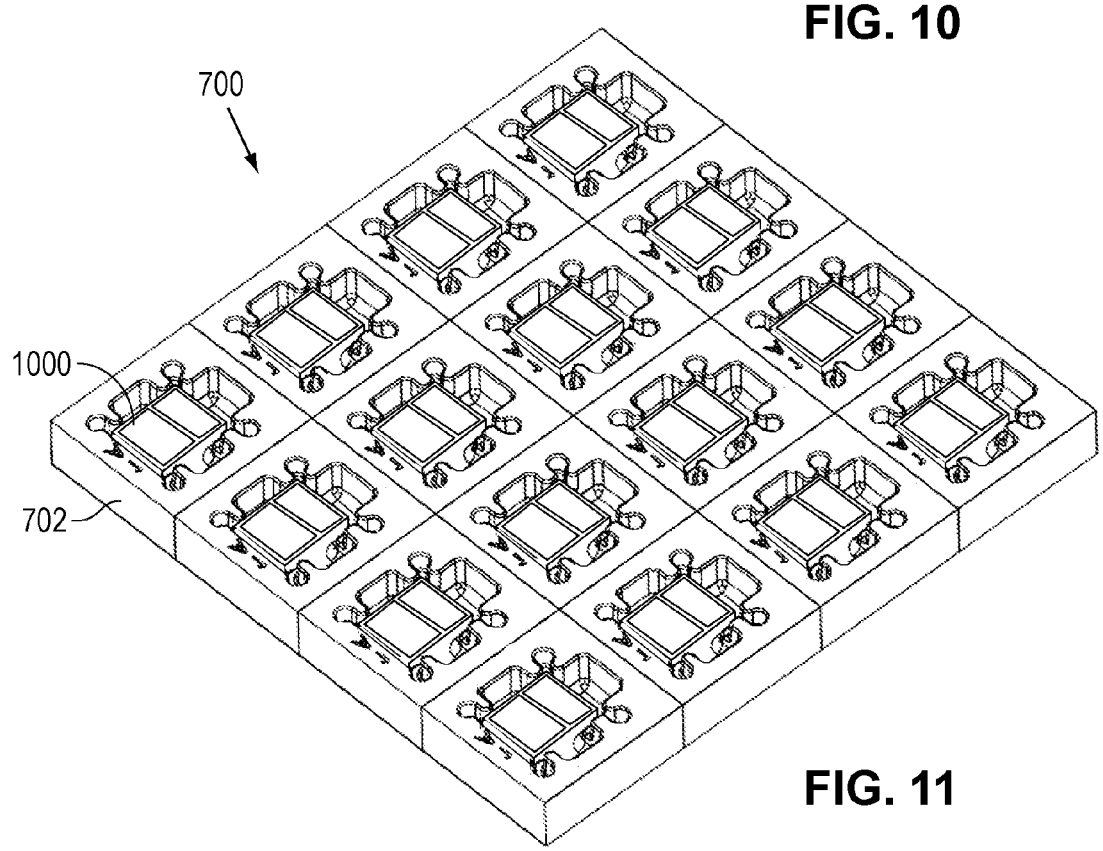
Figure 12:
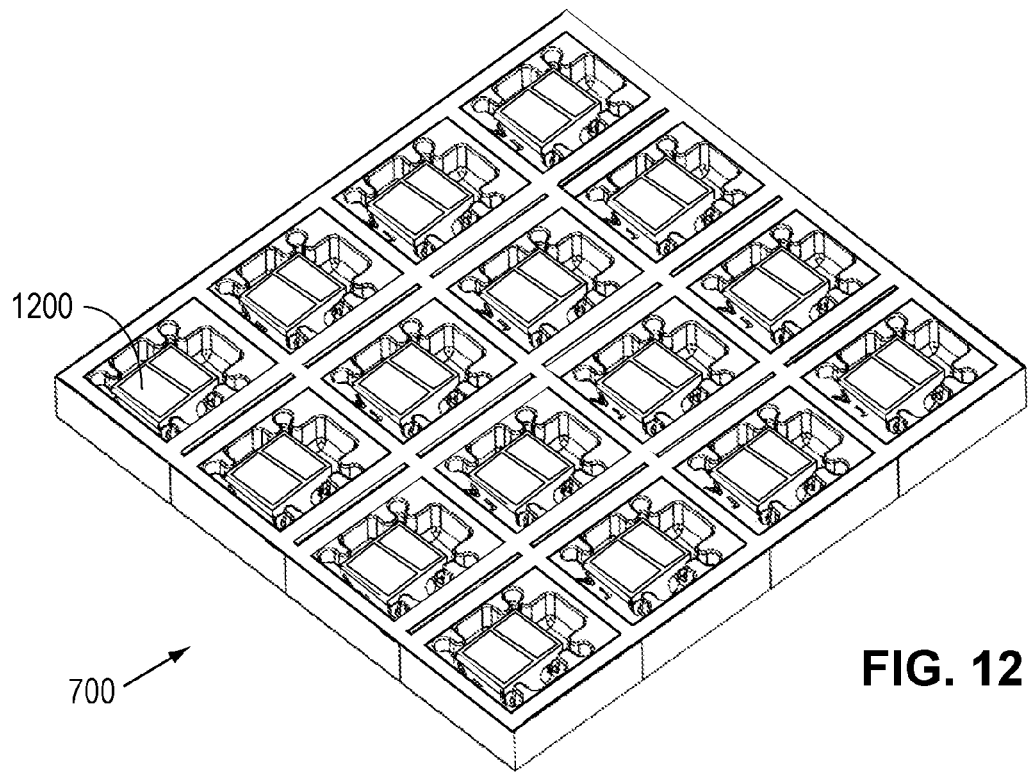
FIG. 12 illustrates a perspective view of the bonding of an array of metal strips on the back of the populated array of FIG. 11 in one or more embodiments of the present disclosure.

FIG. 11 shows array 700 with housings 702 fully populated with LEDs 1000. FIG. 12 shows an array 1200 of metal strips bonded to the back of array 700. The metal strips may form a grid pattern. Glue may be applied to array 700, 1200, or both to bond the two arrays. The glue may be silicone, epoxy, or another adhesive. The combined array is then singulated to form individual LED modules.

Figure 13:
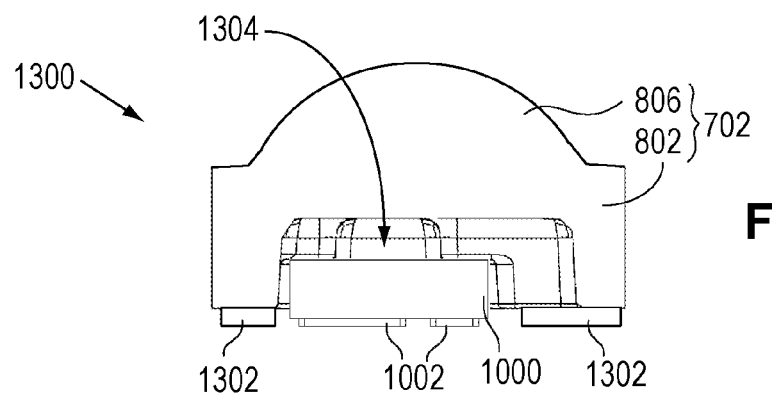
FIGS. 13 and 14 respectively illustrate cross-sectional and bottom plan views of one example LED module singulated from the array of FIG. 12 in one or more embodiments of the present disclosure.
Figure 14:
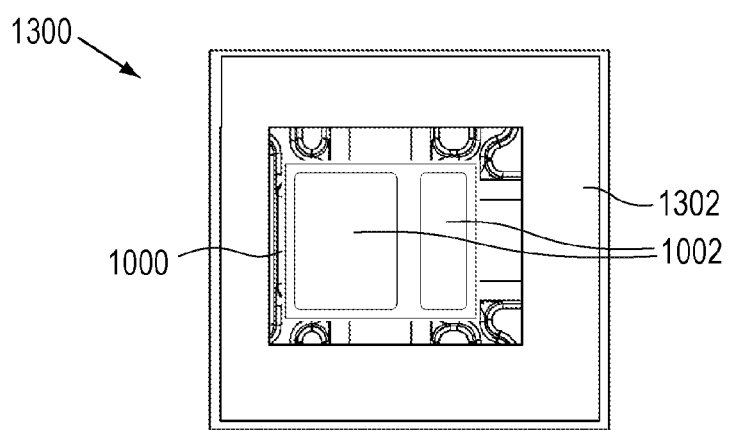

FIGS. 13 and 14 respectively illustrate a cross-sectional side view and a bottom plan view of one example singulated module 1300 from the combined array in one or more embodiments of the present disclosure. Once singulated, the metal strips of array 1200 form one or more bond pads 1302 along the perimeter of each housing 702. Bond pads 1302 of housing 702 help bond pads 1002 of LED 1000 to fix module 1300 to a substrate such as a printed circuit board.

Figure 15:
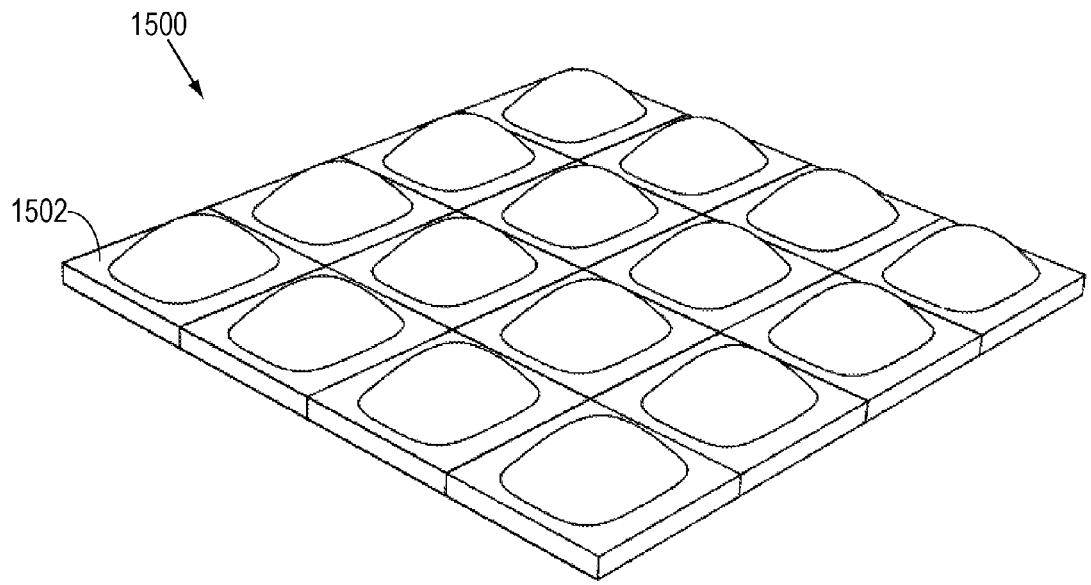
FIG. 15 illustrates a perspective view of an example array of lenses in one or more embodiments of the present disclosure.

Instead of a housing with integrated housing body and lens, the housing body and the lens may be fabricated in separate arrays and then bonded together in one or more embodiments of the present disclosure. FIG. 15 illustrates an example array 1500 of lens 1502 (only one is labeled) in one or more embodiments of the present disclosure. Array 1500 may be glass that is conventionally molded. Common moldable glass materials include B270, Pyrex, Tempax, Borofloat 33, and F2 glass. Alternatively array 1500 may be anotherhigh index material with a RI of 1.5 or greater (e.g., 1.7 or greater), such as sapphire, diamond, alumina, cubic zirconia. Array 1500 may also be made of hard or soft silicone with an RI of 1.4 or greater. Array 1500 may be any size, and a large array may be separated (e.g., sawed) into smaller arrays for easier handling and processing.

Figure 16:
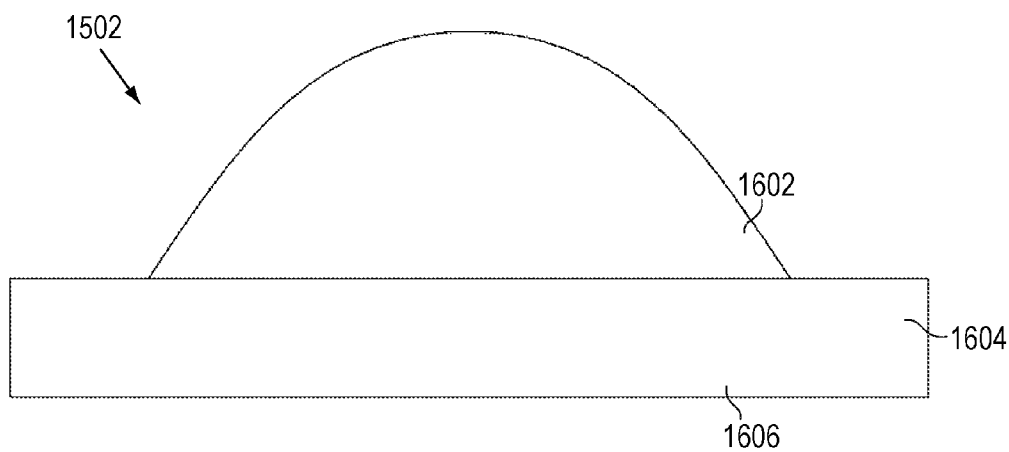
FIG. 16 illustrates a cross-sectional view one example lens in the array of FIG. 15 in one or more embodiments of the present disclosure.

FIG. 16 illustrates a cross-sectional side view of one example lens 1502 in array 1500 in one or more embodiments of the present disclosure. Lens 1502 includes a lens portion 1602 and a mount portion 1604 with a flat bottom 1606. Lens portion 1602 has a shape, dome-like or otherwise, that helps to extract light from the LED die.

Figure 17:
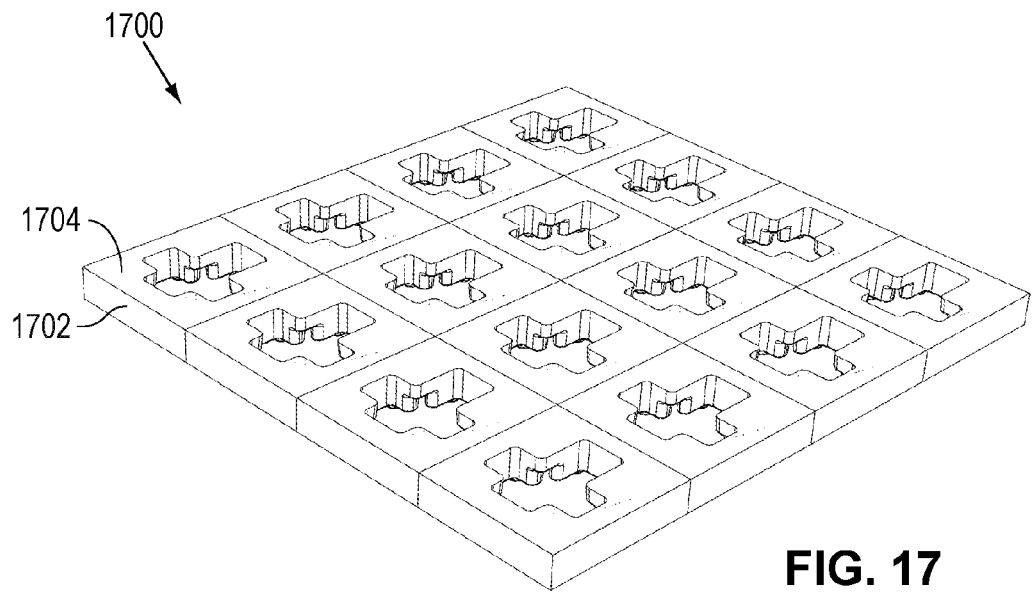
FIGS. 17 and 18 illustrate perspective top and the bottom views of an array of housing bodies in one or more embodiments of the present disclosure.
Figure 18:
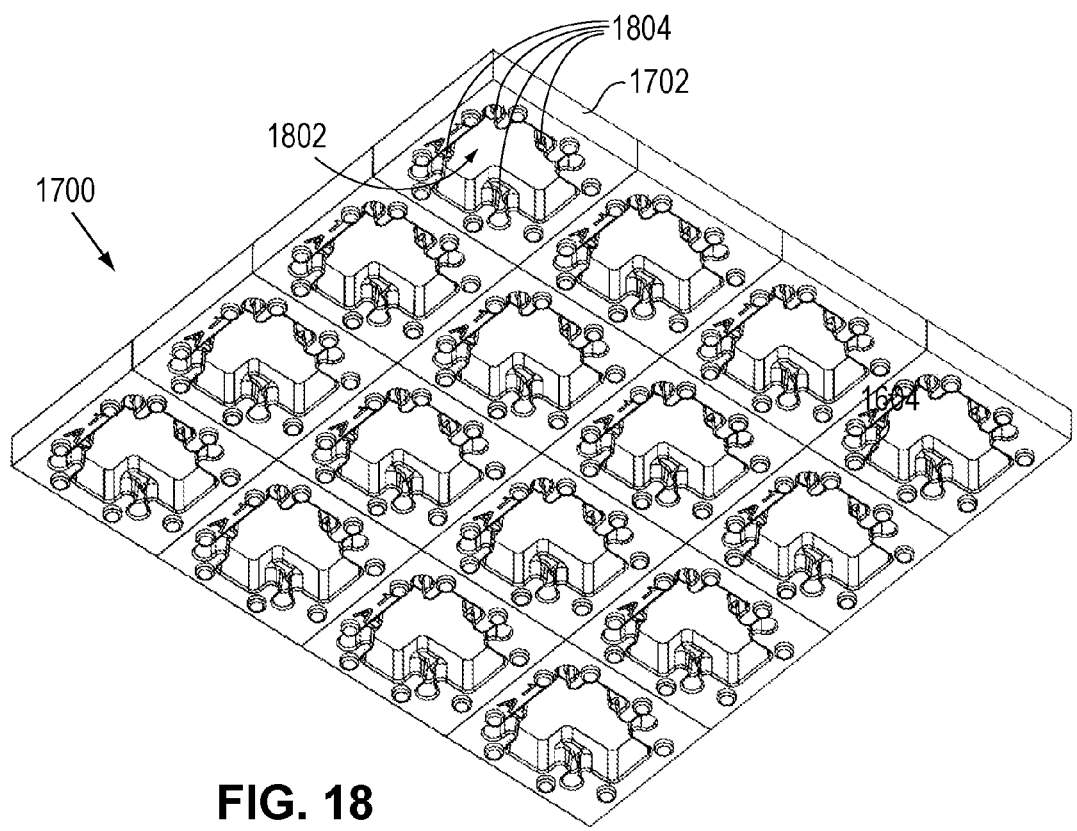

FIG. 17 illustrates a top view of an array 1700 of housing bodies 1702 (only one is labeled) in one or more embodiments of the present disclosure. Housing bodies 1702 have a flat top surface 1704 for receiving lenses 1502. FIG. 18 illustrates a bottom view array 1700 of housing bodies 1702 (only one is labeled). Housing bodies 1702 each define a bottom opening 1802 with four landing pads/corner stops 1804. Corner stops 1804 provides an air gap between the top surface of the LED and the bottom surface 1606 (FIG. 16) of lens 1502 (FIGS. 15 and 16). Corner stops 1804 also define how deeply the LED is seated in bottom opening 1802 (FIG. 18) and how far the LED protrudes from the bottom opening. Array 1700 may be a white plastic that is conventionally molded. For example, array 1700 may be a PPA such as Zytel available from DuPont, Amodel from Solvay Advanced Polymers, or an LCP. Array 1700 may be any size, and a large array may be separated (e.g., sawed) into smaller arrays for easier handling and processing.

Figure 19:
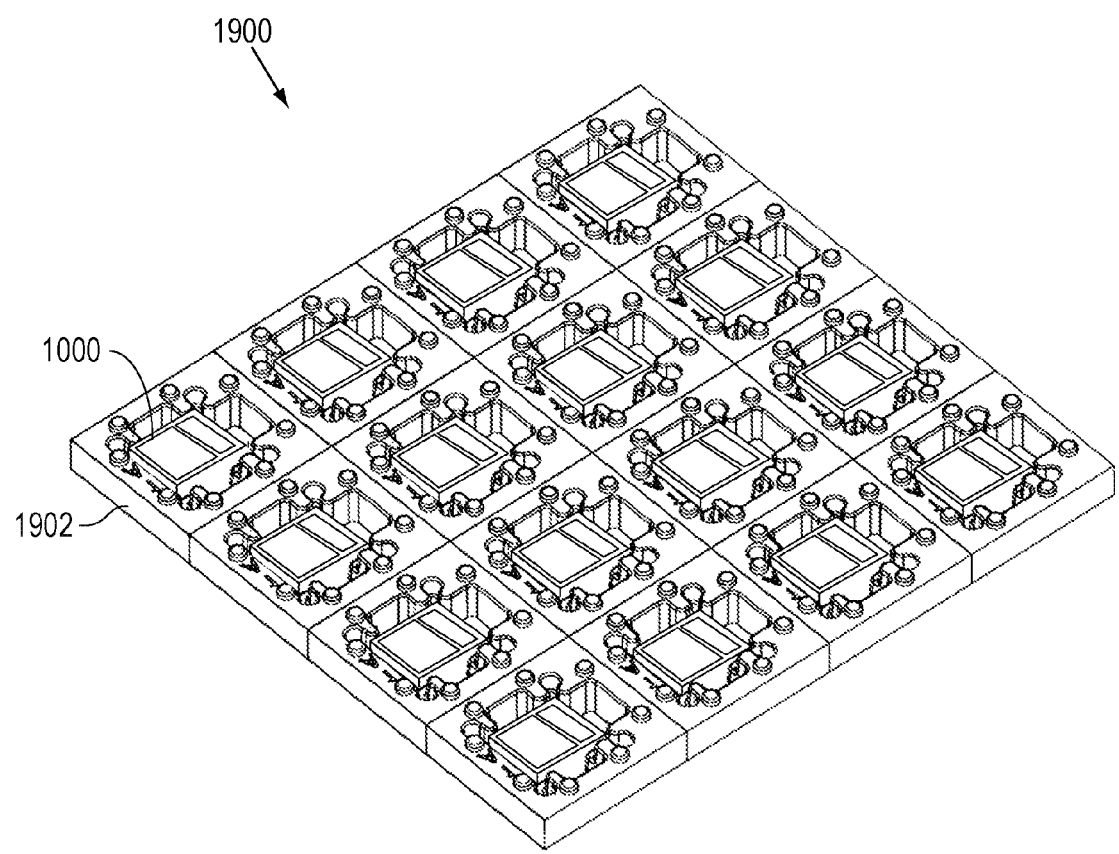
FIG. 19 illustrates a perspective bottom view of a combined array from the bonding of the lens and housing arrays of FIGS. 15 and 17 and the placement of LED into the housings of the combined array in one or more embodiments of the present disclosure.

FIG. 19 shows that arrays 1500 and 1700 are bonded to form a combined array 1900 of housings 1902 (only one is labeled), and LED 1000 are placed into bottom openings 1802 (FIG. 18) and bonded to corner stops 1804 (FIG. 18) of housings bodies 1702 (FIGS. 17 and 18). Glue may be applied to corner stops 1804, the corners of LEDs 1000, or both before the LEDs are placed. The glue may be silicone, epoxy, or another adhesive. Combined array 1900 is then singulated to form individual LED modules.

Figure 20:
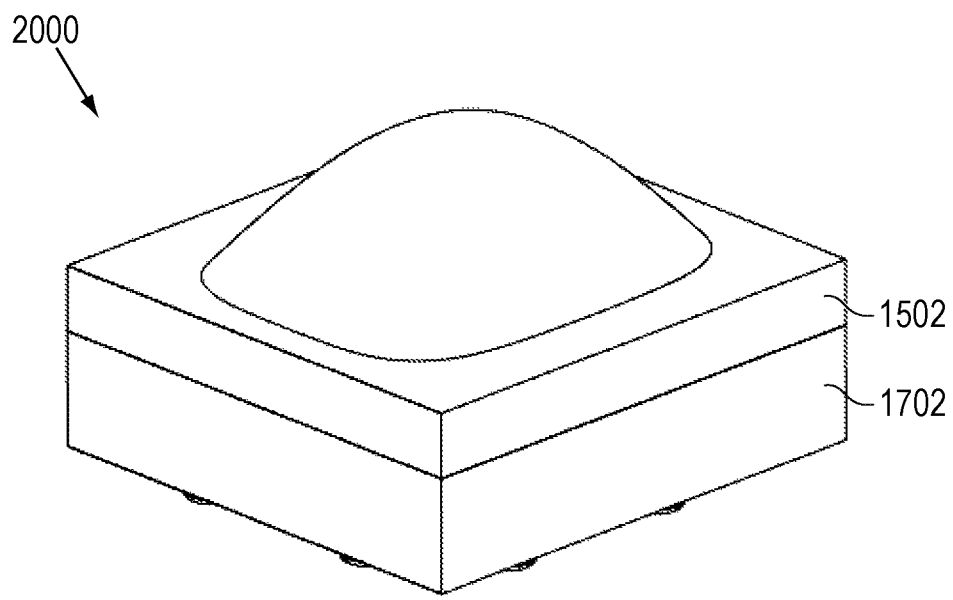
FIGS. 20 and 21 respectively illustrate perspective top and bottom views of one example LED module singulated from the array of FIG. 19 in one or more embodiments of the present disclosure.
Figure 21:
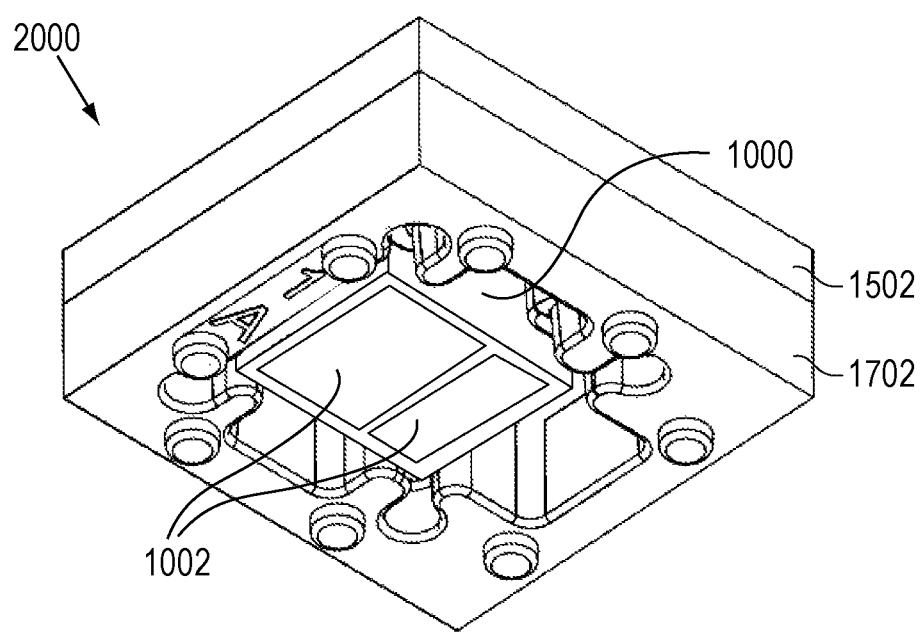
Figure 22:
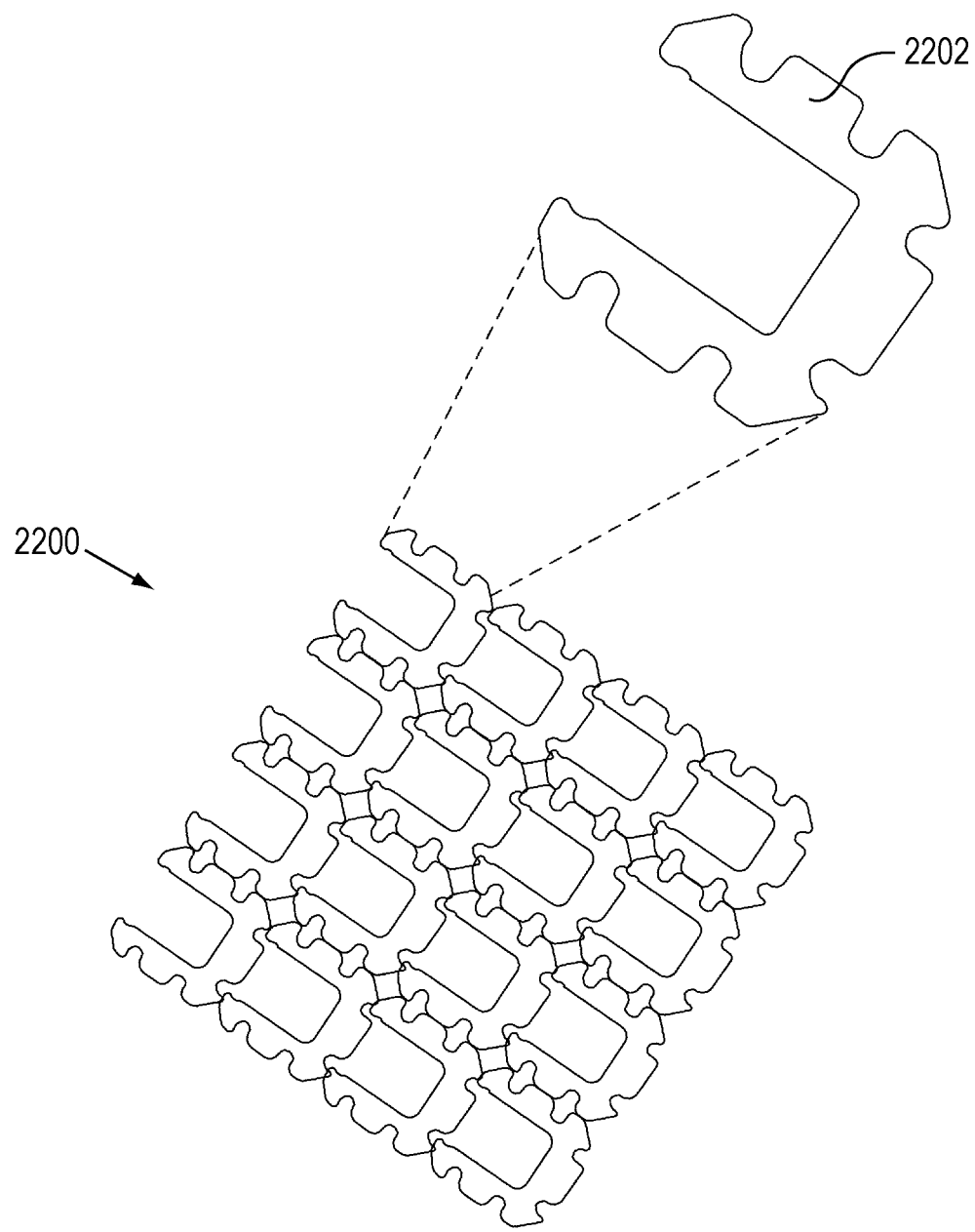
FIG. 22 illustrates a perspective view of an array of metal pads to be bonded to the back of the LED modules of FIG. 21 in one or more embodiments of the present disclosure.

FIGS. 20 and 21 respectively illustrate a cross-sectional side view and a bottom plan view of one example singulated LED module 2000 from combined array 1900 in one or more embodiments of the present disclosure. As lens 1502 is bonded to housing body 1702, the lens should not detach from the housing body. As lens 1502 is fixed to housing body 1702, its size is not limited by the size of the submount of LED 1000. For example, a dome-like lens 102 may have a bottom surface that is larger than the top surface of LED 116. FIG. 22 shows a metal bond pad 2202 that is bonded to the bottom of LED module 2000. Glue may be applied to module 2000, bond pad 2202, or both to bond them together. The glue may be silicone, epoxy, or another adhesive. Alternatively, an array 2200 of metal pads 2202 is bonded to the back of combined array 1900 before the combined array is singulated to form individual modules.

Figure 23:
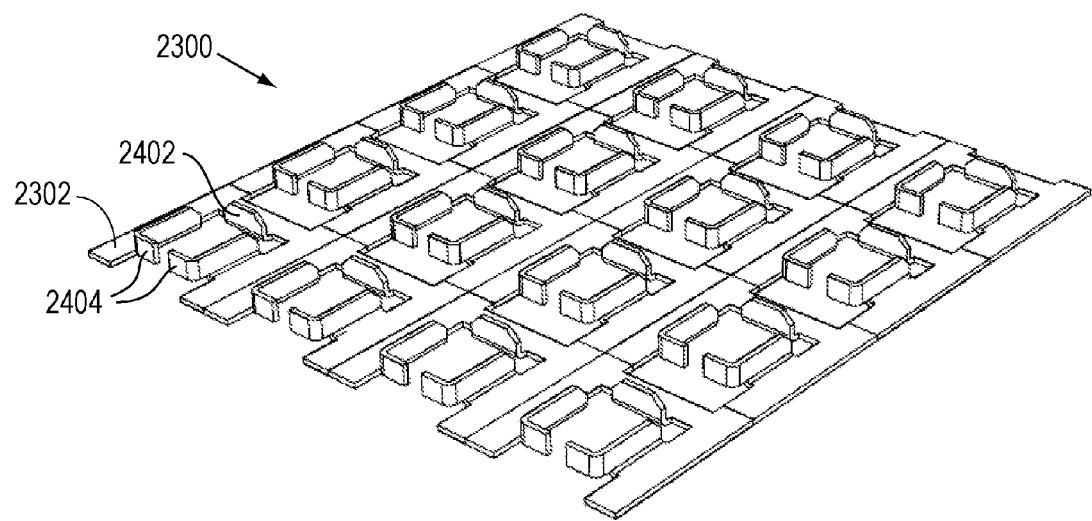
FIG. 23 illustrates perspective top view of an array of metal pads in one or more embodiments of the present disclosure.
Figure 24:
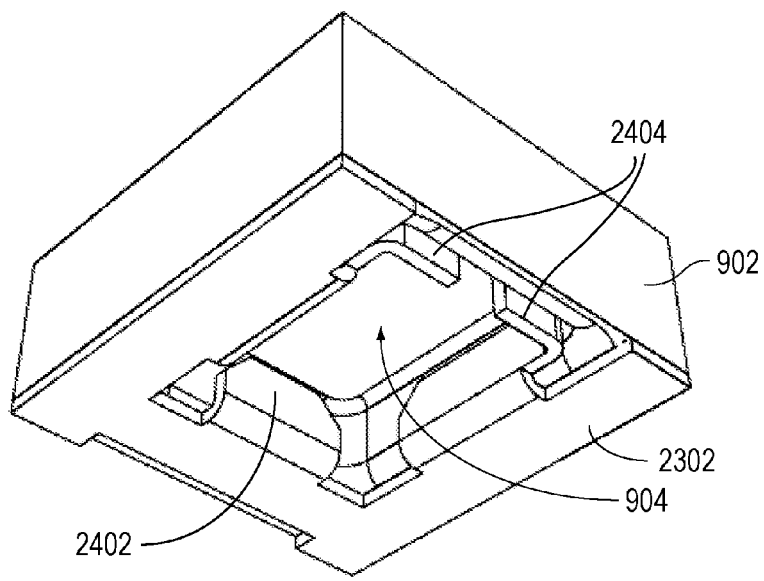
FIG. 24 illustrates perspective bottom view of one example metal pad from the array of FIG. 23 bonded to a housing in one or more embodiments of the present disclosure.

The metal bond pads on the back of the above described modules may include tabs that hold the LEDs in one or more embodiments of the present disclosure. FIG. 23 shows that an array 2300 of metal bond pads 2302 (only one is labeled) in one or more embodiments of the present disclosure. Array 2300 may be any size, and a large array may be separated (e.g., sawed) into smaller arrays for easier handling and processing. FIG. 24 illustrates an enlarged view of one example bond pad 2302 bonded to or inserted molded with housing 902. Bond pad 2302 includes one straight vertical tab 2402 and two L-shaped vertical tabs 2404 that define a guide for receiving and positioning an LED. By providing guide tabs 2402 and 2404 with bond pad 2302, the LED may be positioned consistently from LED module to LED module as long as array 2300 is consistently aligned with the housing array. Bond pad 2302 may also be used with housings 702 and 1902.

Various other adaptations and combinations of features of the embodiments disclosed are within the scope of the invention. Numerous embodiments are encompassed by the following claims.

What is claimed is:
1. A light-emitting diode (LED) module, comprising:
   a housing body, comprising:
      a recess;
      a top opening in the recess;
      clamps positioned around the recess; and
      a bottom opening coupled to the top opening, the bottom opening comprising a ceiling, the ceiling defining glue overflow channels;
   a metal shim, comprising:
      a base plate abutting a bottom of the housing body, the base plate forming a bond pad;

molding tabs extending from the base plate into the housing body; and holes each defined partly by a molding tab and the base plate, wherein the holes are filled with a housing material that forms part of the housing body so the metal shim and the housing body form an integral structure;

a lens;

a ceramic phosphor plate fixed to the bottom of the lens, wherein the lens is received in the recess so the ceramic phosphor plate fully covers the top opening and the clamps are plastically deformed to clamp the lens; and an LED comprising a submount and one or more flip chip LED dies mounted on the submount, wherein the submount comprises bottom pads, each LED die comprises a n-type layer, a light-emitting layer, and a p-type layer, and the submount is seated completely in the bottom opening.

2. The LED module of claim 1, wherein one or more of the top and the bottom openings comprise reflective or scattering sidewalls.

3. The LED module of claim 1, wherein the lens has a bottom surface larger than a top surface of the LED.

\* \* \* \* \*